United States Patent
Nelson et al.

(10) Patent No.: US 7,968,201 B2
(45) Date of Patent: Jun. 28, 2011

(54) LIGHT TRANSMITTANCE OPTIMIZING COATED GLASS ARTICLE FOR SOLAR CELL AND METHOD FOR MAKING

(75) Inventors: Douglas M. Nelson, Curtis, OH (US); Gary Nichol, Warrington (GB); Srikanth Varanasi, Toledo, OH (US)

(73) Assignees: Pilkington Group Limited, St. Helens (GB); Pilkington North America, Inc., Toledo, OH (US)

( * ) Notice: Subject to any disclaimer, the term of this patent is extended or adjusted under 35 U.S.C. 154(b) by 476 days.

(21) Appl. No.: 11/990,475

(22) PCT Filed: Aug. 24, 2006

(86) PCT No.: PCT/US2006/033078
§ 371 (c)(1),
(2), (4) Date: Feb. 14, 2008

(87) PCT Pub. No.: WO2007/027498
PCT Pub. Date: Mar. 8, 2007

(65) Prior Publication Data
US 2009/0155619 A1    Jun. 18, 2009

(51) Int. Cl.
*B32B 17/06* (2006.01)
*B05D 5/06* (2006.01)
*C23C 16/00* (2006.01)
*C03C 17/00* (2006.01)

(52) U.S. Cl. ........ 428/432; 428/336; 428/701; 428/689; 428/697; 428/699; 427/166; 427/255.15; 427/255.19; 427/255.28; 65/60.5

(58) Field of Classification Search ............... 428/432, 428/336, 705, 689, 697, 699, 701; 427/166, 427/255.15, 255.19, 255.28; 65/60.5
See application file for complete search history.

(56) References Cited

U.S. PATENT DOCUMENTS

| | | | |
|---|---|---|---|
| 4,377,613 A | 3/1983 | Gordon | |
| 4,419,386 A | 12/1983 | Gordon | |
| 4,504,526 A | 3/1985 | Hofer et al. | |
| 4,746,372 A | 5/1988 | Tajika et al. | |
| 5,698,262 A | 12/1997 | Soubeyrand et al. | |
| 5,773,086 A | 6/1998 | McCurdy et al. | |
| 6,238,738 B1 | 5/2001 | McCurdy | |
| 6,281,429 B1 * | 8/2001 | Takada et al. | 136/256 |
| 6,602,606 B1 * | 8/2003 | Fujisawa et al. | 428/432 |

FOREIGN PATENT DOCUMENTS

JP    61-159771 A    7/1986

OTHER PUBLICATIONS

Natsuhara, H. et al; Hydrogen-radical durability of $TiO_2$ thin films for protecting transparent conducting oxide for Si thin film solar cells; Thin Solid Films; Apr. 22, 2003; pp. 253-256; Elsevier Science B.V.; vol. 430, No. 1-2; XP004427564.

Mroz, B. et al; Influence Of Hydrogen On Optical Properties Of LPCVD Amorphous Silicon Films; 26th PVSC, IEEE; Sep. 30/Oct. 3, 1997; pp. 671-673; XP002418332, Anaheim, California.

* cited by examiner

*Primary Examiner* — Gwendolyn Blackwell
(74) *Attorney, Agent, or Firm* — Marshall & Melhorn, LLC

(57) ABSTRACT

A multi-layer thin film stack, particularly suitable as a component of a solar cell, is deposited on a transparent dielectric substrate. The multi-layer film stack comprises a transparent electrically conductive metal oxide layer deposited over the dielectric substrate, the conductive metal oxide layer having a refractive index less than 2.0, a light transmittance optimizing interlayer having a refractive index between 2.3 and 3.5, deposited over the electrically conductive metal oxide layer, and a silicon layer having a refractive index of at least 4.5 deposited over the light transmittance optimizing interlayer. The film stack can be deposited by any suitable method, but deposition of each of these layers by atmospheric chemical vapor deposition is preferred.

19 Claims, No Drawings

LIGHT TRANSMITTANCE OPTIMIZING COATED GLASS ARTICLE FOR SOLAR CELL AND METHOD FOR MAKING

BACKGROUND OF THE INVENTION

Amorphous silicon solar cells are being used in increasingly broad applications, ranging from civilian goods such as electronic calculators and watches to electric power supply. In general, amorphous silicon solar cells have a multi-layer structure comprising a base glass plate/transparent conductive film/amorphous silicon film/metal electrode film. Sunlight incident on such a solar cell passes from the base glass plate side through the transparent conductive film and then enters the amorphous silicon film. The base glass plate and the transparent conductive film are hence required to have a high transmittance for good performance.

Such solar cells, when used for electric power supply, need to have a large area exposed to incoming solar radiation. Consequently, these solar cells frequently employ an inexpensive soda-lime glass (alkali-containing glass) produced by the float process as the base glass plate. A thin film of $SiO_2$ (silicon oxide) is often used as a barrier film to prevent migration of alkali ions from the glass into other elements of the multi-layer structure of the film stack. When these solar cells are for use in electric power supply, $SnO_2$ films deposited by CVD are also frequently employed, because these films are relatively inexpensive and highly suitable for mass production and have a higher adhesion strength than $SnO_2$ films deposited by sputtering or vacuum vapor deposition.

Thus, in amorphous silicon solar cells for electric power supply, it is important for the transparent conductive film to have reduced electrical resistance, because these cells have a large panel area. In particular, the transparent conductive film made of $SnO_2$, which is relatively inexpensive, is made to have reduced electrical resistance as a whole by doping the $SnO_2$ with an appropriate impurity and by increasing the thickness of the $SnO_2$ coating.

Glass substrates constituted of a soda-lime glass plate and a two-layer coating formed by successively depositing a continuous alkali barrier film of $SiO_2$ and a transparent conductive film of $SnO_2$ in this order have been subjected to an accelerated test in a high-temperature and high-humidity atmosphere (e.g., 80° C., 100% RH). As a result of such testing, it has been observed that the transparent conductive films having a thickness of 6,000 Å or more developed hair line fractures which inhibit the flow of electrical current flow.

SUMMARY OF THE INVENTION

The present invention relates to a coated glass article which has been found to be particularly suitable as a component of a solar cell, in particular, an amorphous silicon solar cell.

The coated glass article of the present invention comprises a transparent dielectric substrate having a transparent, electrically conductive metal oxide layer deposited thereover. The electrically conductive metal oxide layer has a refractive index of less than 2.0. A light transmittance optimizing interlayer is deposited over the conductive metal oxide layer, and has a refractive index between 2.3 and 3.5. A silicon layer having a refractive index of at least 4.5 is then deposited over the light transmittance optimizing interlayer. Optionally, a color suppression film of one or more layers may be deposited on the dielectric substrate prior to deposition of the transparent, electrically conductive metal oxide layer.

The various layers of the film stack may be deposited by any suitable method, preferably online during the float glass manufacturing process, and most preferably by atmospheric chemical vapor deposition during such process.

DETAILED DESCRIPTION OF THE PREFERRED EMBODIMENT

It has been the objective of many skilled in the art of solar cells to improve upon the efficiency of such solar cells to convert solar radiation to electrical energy, and to do so in a manner that will make the electric energy produced competitive in cost with conventional means of generating electric power.

Among the issues confronting those seeking to make an improved solar cell is formulating a structure which has high electrical conductivity but high transparency to solar radiation. These objectives can be accomplished by creating a film stack which has, among other features, a relatively thick electrically conductive metal oxide layer. The disadvantage of this approach is, as previously noted, an increased likelihood of cracking of the conductive metal oxide layer, which can inhibit the flow of electrical current. The thicker conductive metal oxide layers, say on the order of 6,000-10,000 Å, also result in reduced ability of solar radiation to penetrate the conductive metal oxide layer, so as to be available for conversion to electric energy. Heretofore, thicker conductive metal layers were thought to be desirable, as they exhibit high surface roughness and good electrical conductivity.

The coated glass article of the present invention utilizes various optical interference and other principles of thin films to provide a light transmittance optimizing interlayer being within a chosen range of refractive indices, which strikes a balance between solar energy absorption and reflectance, and at the same time allows use of a thinner conductive metal oxide layer. In this way, more solar radiation penetrates the solar cell, and is more efficiently utilized upon such penetration. Significant increases in solar cell efficiency can be calculated utilizing the coated glass article of the present invention.

In the present invention, a transparent dielectric substrate, for example soda-lime-silica glass, is utilized, although other transparent glasses, preferably also made by the float process, may be used as well.

A suitable metal oxide film, rendered electrically conductive by the addition of a dopant, is deposited on the substrate material. Tin oxide is a preferred metal oxide, preferably doped with fluorine. If tin oxide is utilized, a preferred film thickness is on the order of 3,000-7,500 Å. The refractive index of the conductive metal oxide layer should be less than 2.0, in order to function properly in the context of the entire film stack.

In the present invention, a light transmittance optimizing interlayer is deposited over the electrically conductive metal oxide layer. Materials suitable for the transmittance optimizing interlayer include $TiO_2$ and other suitable substoichiometric metal oxides. The transmittance optimizing interlayer itself need not be of great thickness, on the order of 300-600 Å has been found to be sufficient, with a thickness of 450 Å to 500 Å being preferred. Again, to be compatible with the other layers in the preferred film stack, the light transmittance optimizing interlayer has a refractive index of 2.3 to 3.5. In a particularly preferred embodiment, the refractive index of the light transmittance optimizing interlayer is 2.5 to 3.0.

In a preferred embodiment wherein the subject coated glass article is utilized as a component of an amorphous silicon solar cell, a silicon layer is deposited over the light transmittance optimizing layer. The refractive index of the silicon layer is at least 4.5, preferably at least 5.0.

In some applications, it may be desirable to further suppress iridescence effects which can occur when light is reflected from, or transmitted through, a filmed glass substrate. In connection with the present invention, any suitable single layer or multi-layer color suppression film stack may be utilized, including a single metal oxide layer, a metal oxide layer and silica layer, or a gradient coating layer.

In a preferred embodiment, a metal oxide layer and a silica layer together form an excellent color suppression film stack, as is known from for example, Gordon U.S. Pat. Nos. 4,377,613, and 4,419,386, which are herein incorporated by reference. The color suppression film stack is deposited on the substrate material, prior to deposition of the electrically conductive metal oxide layer. The color suppression film stack is relatively thin, the tin oxide layer having a thickness of 250-600 Å, and the silica layer having a thickness of 250-350 Å.

As will be noted, the thicknesses of the various layers in the film stack of the subject coated glass article may fall within a relatively large range, rather than being only of one specific thickness. As such, the film thicknesses can be optimized to "tune" the overall properties and performance of the film stack.

The layers of the coated glass article of the present invention may be deposited on the dielectric substrate material by any suitable method, but are preferably deposited by atmospheric chemical vapor deposition (APCVD). Other methods of depositing metal oxides by chemical vapor deposition are described, for example, in U.S. Pat. Nos. 5,698,262; 5,773,086 and 6,238,738, each of which is incorporated by reference herein.

To practice the preferred method of film deposition, a gaseous mixture is maintained at a temperature below that at which it reacts to form the material to be deposited, and is delivered to a location near a flat glass substrate to be coated, the substrate being at a temperature above the reaction temperature of the reactants. The precursor gas mixture is thereafter introduced into the vapor space directly over the substrate. The heat from the substrate raises the temperature of the precursor gas above the thermal decomposition temperature of the precursor compounds.

High deposition rates are important from a practical standpoint when coating substrates in a manufacturing process. This is particularly true for an on-line float glass process, where the glass ribbon is traveling at a specific line speed and where a specific coating thickness is required.

A float glass installation may be utilized as a means for practicing the method of the present invention. One specific example of a float glass installation is hereinafter described. The float glass apparatus more particularly comprises a canal section along which molten glass is delivered from a melting furnace, to a float bath section wherein a continuous glass ribbon is formed in accordance with the well-known float process. The glass ribbon advances from the bath section through an adjacent annealing lehr and a cooling section. The continuous glass ribbon serves as the substrate upon which the desired coating is deposited in accordance with the present invention.

The float section includes a bottom section within which a bath of molten tin is contained, a roof, opposite sidewalls, and end walls. The roof, side walls, and end walls together define an enclosure in which a non-oxidizing atmosphere is maintained to prevent oxidation of the molten tin.

Additionally, gas distributor beams are located in the bath section. The distributor beams in the bath section may be employed to apply additional coatings onto the substrate prior to applying the metal oxide coating by the method of the present invention. The additional coatings may include silicon and silica.

In operation, the molten glass flows along the channel beneath a regulating tweel and downwardly onto the surface of the tin bath in controlled amounts. On the tin bath the molten glass spreads laterally under the influences of gravity and surface tension, as well as certain mechanical influence, and it is advanced across the bath to form the ribbon. The ribbon is removed over lift out rolls and is thereafter conveyed through the annealing lehr and the cooling section on aligned rolls. The application of the coating of the present invention may take place in the float bath section, or further along the production line, for example, in the gap between the float bath and the annealing lehr, or in the annealing lehr.

A suitable non-oxidizing atmosphere, generally nitrogen, or a mixture of nitrogen and hydrogen in which nitrogen predominates, is maintained in the bath enclosure to prevent oxidation of the tin bath. The atmosphere gas is admitted through conduits operably coupled to a distribution manifold. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. For purposes of the present invention the above-noted pressure range is considered to constitute normal atmospheric pressure. Heat for maintaining the desired temperature regime in the tin bath and the enclosure may be provided by radiant heaters within the enclosure. The atmosphere within the lehr is typically atmospheric air, as the cooling section is not enclosed and the glass ribbon is open to the ambient atmosphere. Ambient air may be directed against the glass ribbon, for example, by fans, in the cooling section. Heaters may also be provided within the annealing lehr for causing the temperature of the glass ribbon to be gradually reduced in accordance with a predetermined regime as it is conveyed therethrough.

Gas distributor beams are generally positioned in the float bath to deposit the various coatings on the glass ribbon substrate but might be positioned downstream of the float bath. The gas distributor beam is one form of reactor that can be employed in practicing the process of the present invention.

A conventional configuration for the distributor beams suitable for supplying the precursor materials in accordance with the invention is, generally, an inverted generally channel-shaped framework formed by spaced inner and outer walls and defining at least two enclosed cavities. A suitable heat exchange medium is circulated through the enclosed cavities in order to maintain the distributor beams at a desired temperature. A preferred distributor beam is disclosed in U.S. Pat. No. 4,504,526 to Hofer et al., which is incorporated herein by reference.

The precursor gas mixture is supplied through a fluid-cooled supply conduit. The supply conduit extends along the distributor beam and admits the gas through drop lines spaced along the supply conduit. The supply conduit leads to a delivery chamber within a header carried by the framework. Precursor gases admitted through the drop lines are discharged from the delivery chamber through a passageway toward a coating chamber defining a vapor space opening onto the glass where they flow along the surface of the glass.

Baffle plates may be provided within the delivery chamber for equalizing the flow of precursor materials across the distributor beam to assure that the materials are discharged against the glass in a smooth, laminar, uniform flow entirely across the distributor beam. Spent precursor materials are collected and removed through exhaust chambers along the sides of the distributor beam.

Various forms of distributor beams used for chemical vapor deposition are suitable for the present method and are known in the prior art.

One such alternative distributor beam configuration generally introduces the precursor gas mixture through a gas supply duct where it is cooled by cooling fluid circulated through cooling ducts. The gas supply duct opens through an elongated aperture into a gas flow restrictor.

The gas flow restrictor comprises a plurality of metal strips longitudinally crimped in the form of a sine wave and vertically mounted in abutting relationship with one another extending along the length of the distributor. Adjacent crimped metal strips are arranged "out of phase" to define a plurality of vertical channels between them. These vertical channels are of small cross-sectional area relative to cross-sectional area of the gas supply duct, so that the gas is released from the gas flow restrictor at substantially constant pressure along the length of the distributor.

The coating gas is released from the gas flow restrictor into the inlet side of a substantially U-shaped guide channel generally comprising an inlet leg, a coating chamber which opens onto the hot glass substrate to be coated, and an exhaust leg, whereby used coating gas is withdrawn from the glass. The rounded corners of the blocks defining the coating channel promote a uniform laminar flow of coating parallel to the glass surface across the glass surface to be coated.

EXAMPLES

The following examples, which constitute the best mode presently contemplated by the inventors for practicing the invention, are presented solely for the purpose of further illustrating and disclosing the present invention, and are not to be construed as a limitation on the invention.

The examples set forth in Tables 1-4 are the result of computer generated modeling of various configurations of the film stack of the present coated glass article, as well as film stack configurations falling outside the scope of the present coated glass which may provide a useful basis for comparison with the present invention.

As used in the Tables—Examples 1-16, the noted terms have the following meanings:

Rg means the percentage reflectance of visible light from the major surface of a glass sheet upon which no thin films have been deposited.

Rg(a*) and Rg(b*) mean the color of light reflected from the unfilmed surface of a glass sheet according to the CIELAB color coordinates a* and b*, respectively.

ABS means the percentage of visible light absorbed by the one or more thin films deposited on a coated glass sheet.

T means the percentage of visible light absorbed by an essentially amorphous solar silicon cell that can be converted to electrical energy.

Specifically, Examples 1-4 fall within the scope of the present invention. Examples 1-4 may be contrasted with Examples 5-8, where in Examples 1-4, the film stack of the present invention is utilized with a silicon layer of 5000 Å in thickness, as would be representative of a predominantly amorphous silicon solar cell. As will be observed, glass side reflectance (Rg) of the modeled structure of Examples 1-4 is very low, being in the range of approximately 5.2-8.0%. Such low reflectance will assist in maximizing the solar radiation which is retained in the solar cell structure and is available for conversion to electrical energy.

It will also be observed that Examples 1-8 all utilize iridescence suppressing structures. Of the examples available, Examples 2 and 3, wherein the undoped $SnO_2$ layer is thinner, (250 Å v 600 Å) seems to provide the lowest Rg. Examples 2 and 3 also differ in the thickness of the doped $SnO_2$ layers. Fluorine is chosen as the dopant to be modeled in these examples. Very little difference in Rg is predicted despite the 2000 Å difference in the thickness of the $SnO_2$:F layer.

Examples 5-8 comparatively show how the interaction between the light transmittance optimizing interlayer works with the amorphous silicon layer to reduce loss of light through reflection and enhances light transmittance/absorption. Rg in Examples 5-8 is on the order of 20% higher than in Examples 1-4.

Examples 9-12 and 13-16 provide a basis for comparison with the examples utilizing the light transmission optimizing interlayer, as no such light optimizing interlayer is present. As will be noted, particularly in Examples 13-16, the Rg is substantially, and undesirably, higher than in Examples 1-4. Indeed, the Rg of Examples 13-16 is, on average, more than 2 times that of the Rg in Examples 1-4. It can, thus, be observed that the light transmission optimizing interlayer of $TiO_2$ has a significant, and highly beneficial effect in decreasing the amount of light reflectance. Light absorption in Examples 1-4 ranges from 6-10% higher than in Examples 13-16, significantly improving the efficiency of a solar cell utilizing the present invention.

TABLE 1

| Examples 1-4 | | | | |
|---|---|---|---|---|
| Example | 1 | 2 | 3 | 4 |
| $SnO_2$ | 600 | 250 | 250 | 600 |
| $SiO_2$ | 250 | 250 | 250 | 250 |
| $SnO_2F$ | 5300 | 5300 | 7300 | 7300 |
| $TiO_2$ | 450 | 500 | 500 | 500 |
| Si | 5000 | 5000 | 5000 | 5000 |
| ABS | 90.288 | 92.933 | 93.054 | 90.348 |
| T | 1.72 | 1.79 | 1.73 | 1.69 |
| Rg (a*) | 6.55 | 7.048 | 6.656 | 3.662 |
| Rg (b*) | −10.411 | −12.516 | −11.727 | −13.726 |
| Rg | 7.992 | 5.277 | 5.216 | 7.962 |
| ABS (Si) | 77.96 | 80.22 | 76.777 | 74.326 |

Table I—Examples 1-4 show the use of the present invention as a component of an amorphous silicon solar cell and the results of optical analysis of the same.

TABLE 2

| Examples 5-8 | | | | |
|---|---|---|---|---|
| Examples | 5 | 6 | 7 | 8 |
| $SnO_2$ | 600 | 250 | 250 | 600 |
| $SiO_2$ | 250 | 250 | 250 | 250 |
| $SnO_2F$ | 5300 | 5300 | 7300 | 7300 |
| $TiO_2$ | 450 | 500 | 500 | 500 |
| Si | | | | |
| ABS | 12.328 | 12.711 | 16.277 | 16.022 |
| T | 59.78 | 61.14 | 58.99 | 57.71 |
| Rg (a*) | −2.235 | −4.59 | −3.74 | −0.74 |
| Rg (b*) | 1.231 | 2.0 | 2.0 | −0.61 |
| Rg | 27.9 | 26.149 | 24.73 | 26.268 |

Table 2—Examples 5-8 show the measured optical properties of the present invention with a fluorine-doped tin oxide TCO layer, but not combined with an amorphous silica coating.

TABLE 3

Examples 9-12

| Examples | 9 | 10 | 11 | 12 |
|---|---|---|---|---|
| $SnO_2$ | 250 | 600 | 250 | 600 |
| $SiO_2$ | 250 | 600 | 250 | 600 |
| $SnO_2F$ | 5300 | 5300 | 7300 | 7300 |
| $TiO_2$ | | | | |
| Si | | | | |
| ABS | 10.865 | 10.669 | 13.969 | 13.65 |
| T | 77.9 | 75.77 | 75.19 | 72.86 |
| Rg (a*) | 0.20 | −6.1 | −1.57 | −4.29 |
| Rg (b*) | −1.83 | −8.55 | −0.21 | −2.97 |
| Rg | 11.33 | 13.57 | 10.85 | 13.49 |

Table 3—Examples 9-12 show the optical properties which can be expected without the use of the light transmission optimizing interlayer.

TABLE 4

Examples 13-16

| Example | 13 | 14 | 15 | 16 |
|---|---|---|---|---|
| $SnO_2$ | 250 | 601 | 250 | 601 |
| $SiO_2$ | 250 | 250 | 250 | 250 |
| $SnO_2F$ | 5300 | 5300 | 7300 | 7300 |
| $TiO_2$ | | | | |
| Si | 5000 | 5000 | 5000 | 5000 |
| ABS | 84.23 | 82.42 | 85.467 | 83.341 |
| T | 1.61 | 1.54 | 1.55 | 1.5 |
| Rf (a*) | −1.015 | −1.023 | −1.018 | −1.006 |
| Rf (b*) | −3.181 | −3.181 | −3.182 | −3.177 |
| Rf | 35.32 | 35.353 | 35.32 | 35.356 |
| Rg (a*) | −3.057 | 2.721 | −1.544 | 0.607 |
| Rg (b*) | −0.175 | 0.44 | −0.694 | −4.624 |
| Rg | 13.567 | 16.04 | 12.983 | 15.159 |
| ABS (Si) | 73.96 | 71.75 | 71.50 | 69.69 |

Table 4—Examples 13-16 show the chemical make-up and optical properties of a known amorphous silicon solar cell without the light transmission optimizing interlayer.

As can be seen from Table 1, those samples including the light reflectance optimizing interlayer have a reduced reflection of incoming solar radiation of 7-8% over those samples not having the reflectance optimizing interlayer. Such a reduction in reflectance could result in an increase in conversion efficiency of 8-9%, which is very significant where the conversion efficiency of conventional solar cells is on the order of 10-12%.

The invention has been disclosed in what is considered to be its preferred embodiment. It must be understood, however, that the specific embodiments are provided only for the purpose of illustration, and that the invention may be practiced otherwise than as specifically illustrated without departing from its spirit and scope.

What is claimed:

1. A coated article suitable for use as a component of a solar cell comprising:
    a transparent dielectric substrate;
    a transparent, electrically conductive metal oxide layer, having a refractive index less than 2.0, deposited over the dielectric substrate;
    a light transmittance optimizing interlayer deposited over the conductive metal oxide layer, the light transmittance optimizing interlayer comprising an oxide of titanium and having a refractive index between 2.3 and 3.5; and
    a silicon layer having a refractive index of at least 4.5 deposited over the light transmittance optimizing interlayer.

2. The coated glass article defined in claim 1, wherein the electrically conductive layer comprises a fluorine doped metal oxide.

3. The coated glass article defined in claim 1, wherein the silicon layer comprises amorphous silicon.

4. The coated glass article defined in claim 1, further comprising a color suppression film interposed between the dielectric substrate and the electrically conductive layer.

5. The coated glass article defined in claim 4, wherein the color suppression film comprises one chosen from the group consisting of: a single metal oxide layer, a metal oxide layer and a silica layer, and a gradient layer.

6. The coated glass article defined in claim 4, wherein the color suppression film comprises a tin oxide layer having a thickness of 250-600 Å, and a silica layer having a thickness of 250-350 Å.

7. The coated glass article defined in claim 1, wherein the light transmittance optimizing interlayer comprises a titanium oxide layer having an average thickness of 300-600 Å.

8. The coated glass article defined in claim 7, wherein the light transmittance optimizing interlayer comprises a titanium oxide layer having an average thickness of 450-500 Å.

9. The coated glass article defined in claim 2, wherein the doped metal oxide layer comprises fluorine-doped tin oxide having a thickness of 5,000-7,500 Å.

10. The coated glass article defined in claim 1, wherein the light transmittance optimizing interlayer has a refractive index between 2.3 and 3.0.

11. The coated glass article defined in claim 2, wherein the doped metal oxide layer comprises fluorine-doped tin oxide having a thickness of 3000-5,500 Å.

12. The coated glass article defined in claim 1, wherein the silicon layer has a refractive index of at least 5.0.

13. The coated glass article defined in claim 1, wherein the electrically conductive layer comprises tin doped indium oxide.

14. A method of forming a coated article suitable for use as a component of a solar cell, comprising:
    providing a heated transparent dielectric substrate;
    depositing over the substrate a transparent, electrically conductive metal oxide layer having a refractive index less than 2.0;
    depositing a light transmittance optimizing interlayer over the conductive metal oxide layer, the light transmittance optimizing interlayer comprising an oxide of titanium and having a refractive index between 2.3 and 3.5; and
    depositing a silicon layer over the light transmittance optimizing interlayer, the silicon layer having a refractive index of at least 4.5.

15. The method defined in claim 14, wherein each layer is deposited online during the float glass manufacturing process.

16. The method defined in claim 14, wherein each layer is deposited by atmospheric chemical vapor deposition.

17. A transparent, coated glass article suitable for use as a component of a solar cell comprising:
    a transparent dielectric substrate;
    a transparent, electrically conductive metal oxide layer having a refractive index less than 2.0 deposited over the dielectric substrate;
    a light transmittance optimizing interlayer deposited over the conductive metal oxide layer, the light transmittance optimizing interlayer comprising an oxide of titanium and having a refractive index between 2.3 and 3.5; and a silicon layer having a refractive index of at least 4.5 deposited over the light transmittance optimizing interlayer; wherein the coated article has a glass side reflectance of 5.2 to 8.0.

18. A coated article suitable for use as a component of a solar cell comprising:
- a transparent dielectric substrate;
- a transparent, electrically conductive tin oxide layer, having a refractive index less than 2.0, deposited over the dielectric substrate;
- a light transmittance optimizing interlayer deposited directly on the conductive tin oxide layer, the light transmittance optimizing the interlayer comprising an oxide of titanium deposited at a thickness of 300 Å-600 Å; and
- a silicon layer having a refractive index of at least 4.5 deposited over the light transmittance optimizing interlayer.

19. A coated article suitable for use as a component of a solar cell comprising:
- a transparent glass substrate;
- a transparent, electrically conductive tin oxide layer, having a refractive index less than 2.0, deposited over the dielectric substrate;
- a light transmittance optimizing interlayer deposited directly on the conductive tin oxide layer, the light transmittance optimizing interlayer comprising $TiO_2$ deposited at a thickness of 450 Å-500 Å; and
- a silicon layer having a refractive index of at least 4.5 deposited over the light transmittance optimizing interlayer.

* * * * *